US00RE45357E

(19) United States
(12) Reissued Patent
Rhodes

(10) Patent Number: US RE45,357 E
(45) Date of Reissued Patent: Feb. 3, 2015

(54) TWIN P-WELL CMOS IMAGER

(75) Inventor: Howard E. Rhodes, San Martin, CA (US)

(73) Assignee: Round Rock Research, LLC, Parsippany, NJ (US)

(21) Appl. No.: 12/714,339

(22) Filed: Feb. 26, 2010

Related U.S. Patent Documents

Reissue of:
(64) Patent No.: 7,538,372
Issued: May 26, 2009
Appl. No.: 10/406,493
Filed: Apr. 4, 2003

U.S. Applications:
(62) Division of application No. 09/207,138, filed on Dec. 8, 1998, now Pat. No. 6,825,878.

(51) Int. Cl.
*H01L 31/062* (2012.01)
*H01L 31/113* (2006.01)

(52) U.S. Cl.
USPC ..... 257/291; 257/292; 257/E27.133

(58) Field of Classification Search
None
See application file for complete search history.

(56) References Cited

U.S. PATENT DOCUMENTS 4,255,677 A 3/1981 Boonstra
4,374,700 A 2/1983 Scott et al.
4,820,936 A 4/1989 Veendrick et al.
4,825,142 A 4/1989 Wang
5,319,604 A 6/1994 Imondi et al.
5,352,921 A * 10/1994 Codama et al. ..... 257/448
5,461,425 A 10/1995 Fowler et al.
5,471,515 A * 11/1995 Fossum et al. ..... 377/60
5,541,402 A 7/1996 Ackland et al.
5,576,763 A 11/1996 Ackland et al.
5,612,799 A 3/1997 Yamazaki et al.
5,614,744 A 3/1997 Merrill
5,625,210 A * 4/1997 Lee et al. ..... 257/292
5,705,846 A 1/1998 Merrill
5,708,263 A 1/1998 Wong (Continued)

FOREIGN PATENT DOCUMENTS

EP 0714099 A1 5/1996
GB 2068639 A 8/1981

(Continued)

OTHER PUBLICATIONS

A. Dickinson, et al., "A 256×256 CMOS Active Pixel Image Sensor with Motion Detection," IEEE International Solid-State Circuits Conference, 1995, pp. 226-227.

(Continued)

*Primary Examiner* — Benjamin Sandvik
(74) *Attorney, Agent, or Firm* — Lerner, David, Littenberg, Krumholz & Mentlik, LLP

(57) ABSTRACT

A CMOS imager which includes a substrate voltage pump to bias a doped area of a substrate to prevent leakage into the substrate from the transistors formed in the doped area. The invention also provides a CMOS imager where a photodetector sensor array is formed in a first p-well and readout logic is formed in a second p-well. The first p-well can be selectively doped to optimize cross-talk, collection efficiency and transistor leakage, thereby improving the quantum efficiency of the sensor array while the second p-well can be selectively doped and/or biased to improve the speed and drive of the readout circuitry.

82 Claims, 7 Drawing Sheets

(56) References Cited

U.S. PATENT DOCUMENTS

| | | | | | |
|---|---|---|---|---|---|
| 5,757,045 | A | | 5/1998 | Tsai et al. | |
| 5,789,788 | A | * | 8/1998 | Ema et al. | 257/371 |
| 5,841,126 | A | | 11/1998 | Fossum et al. | |
| 5,898,196 | A | * | 4/1999 | Hook et al. | 257/292 |
| 5,942,774 | A | * | 8/1999 | Isogai et al. | 257/292 |
| 6,023,293 | A | * | 2/2000 | Watanabe et al. | 348/294 |
| 6,140,630 | A | | 10/2000 | Rhodes | |
| 6,163,044 | A | | 12/2000 | Manning | |
| 6,201,761 | B1 | | 3/2001 | Wollesen | |
| 6,268,748 | B1 | | 7/2001 | Bertin | |
| 6,670,990 | B1 | | 12/2003 | Kochi et al. | |
| 2001/0002045 | A1 | | 5/2001 | Fossum et al. | |
| 2001/0011918 | A1 | | 8/2001 | Kurodo | |

FOREIGN PATENT DOCUMENTS

| | | | |
|---|---|---|---|
| JP | 62190746 | A | 8/1987 |
| JP | A-62190746 | | 8/1987 |
| JP | 04249359 | A | 9/1992 |
| JP | A-04249359 | | 9/1992 |

OTHER PUBLICATIONS

A. Dickinson, et al., "Standard CMOS Active Pixel Image Sensors for Multimedia Applications," Proceedings of Sixteenth Conference on Advanced Research in VLSI, Mar. 27-29, 1995, pp. 214-224.

E-S, Eid, et al., "A 256×256 CMOS Active Pixel Image Sensor," Proc. SPIE, vol. 2415, Apr. 1995, pp. 265-275.

E. Fossum, "CMOS Image Sensors: Electronic Camera on a Chip," IEEE, 1995, pp. 17-25.

E. Fossum, et al., "IEDM A 37×28mm$^2$ 600k-Pixel CMOS APS Dental X-Ray Camera-on-a-Chip with Self-Triggered Readout," IEEE International Solid-State Circuits Conference, 1998, pp. 172-173.

E. Fossum, "Low Power Camera-on-a-Chip Using CMOS Active Pixel Sensor Technology," IEEE, 1995, pp. 74-77.

E. Fossum, "Architectures for focal plane image processing," Optical Engineering, vol. 28, No. 8, Aug. 1989, pp. 865-871.

J. Janesick, et al., "New Advancements in Charge-Coupled Device Technology—Sub-Electron Noise and 4096×4096 Pixel CCDs," Proc. SPIE, vol. 1242, 1990, pp. 223-237.

S.E. Kemeny, et al., Update on Focal-Plane Image Processing Research, Proc. SPIE, vol. 1447, 1991, pp. 243-250.

S. Mendis, et al., "CMOS Active Pixel Image Sensor," IEEE Transactions on Electron Devices, vol. 41, No. 3, Mar. 1994, pp. 452-453.

S.K. Mendis, et al., "A 128×128 CMOS Active Pixel Image Sensor for Highly Integrated Imaging Systems," IEEE, 1993, pp. 583-586.

S.K. Mendis, et al., "CMOS Active Pixel Image Sensors for Highly Integrated Imaging Systems," IEEE Journal of Solid-State Circuits, vol. 32, No. 2, Feb. 1997, pp. 187-197.

S.K. Mendis, et al., "Low-Light-Level Image Sensor with On-Chip Signal Processing," Proc. SPIE, vol. 1952, Nov. 1993, pp. 23-33.

S.K. Mendis, et al., "Progress in CMOS Active Pixel Image Sensors," Proc. SPIE, vol. 2172, May 1994, pp. 19-29.

J. Nakamura, et al., "CMOS Active Pixel Image Sensor with Simple Floating Gate Pixels," IEEE Transactions on Electron Devices, vol. 42, No. 9, Sep. 1995. pp. 1693-1694.

R.H. Nixon, et al., "256×256 CMOS Active Pixel Sensor Camera-on-a-Chip," IEEE Journal of Solid-State Circuits, vol. 31, No. 12, Dec. 1996, pp. 2046-2050.

R.H. Nixon, et al., "256×256 CMOS Active Pixel Sensor Camera-on-a-Chip," IEEE International Solid-State Circuits Conference, 1996, pp. 178-179.

R. Panicacci, et al., "Programmable Multiresolution CMOS Active Pixel Sensor," Proc. SPIE, Vo. 2654, Mar. 1996, pp. 72-79.

R.A. Panicacci, et al., "128Mb/s Multiport Cmos Binary Active-Pixel Image Sensor," IEEE International Solid-State Circuit Conference, 1996, pp. 100-101.

O. Yadid-Pecht, et al., "CMOS Active Pixel Sensor Star Tracker with Regional Electronic Shutter," IEEE Journal of Solid-State Circuits, vol. 32, No. 2, Feb. 1997, pp. 285-288.

O. Yadid-Pecht, et al., "Wide Dynamic Range APS Star Tracker," Proc. SPIE, vol. 2654, Mar. 1996, pp. 82-92.

J. Zarnowski, et al., "Imaging Options Expand with CMOS Technology," Laser Focus World, Jun. 1997, pp. 125-130.

Z. Zhou, et al., "A CMOS Imager with On-Chip Variable Resolution for Light-Adaptive Imaging," IEEE International Solid-State Circuits Conference, 1998, pp. 174-175.

Z. Zhou, et al., "A Digital CMOS Active Pixel Image Sensor for Multimedia Applications," Proc. SPIE, vol. 2894, Sep. 1996, pp. 282-288.

Seghir et al., "Correlation of the Leakage Current and Charge Pumping in Silicon on Isulator Gate-Controlled Diodes," IEEE Transactions on Electron Devices, vol. 40, No. 6, Jun. 1993.

Saitoh et al., "Substrate Bias Voltage Generator Controlled by CMOS Inverter," IEEE, 1998.

Wu et al., "Low Supply Voltage CMOS Charge Pumps," IEEE Journal of Solid-State Circuits, vol. 33, No. 4, Apr. 1998.

Wu, "MOS Charge Pumps for Low-Voltage Operation," IEEE Journal of Solid-State Circuits, vol. 33, No. 4, Apr. 1998.

* cited by examiner

TWIN P-WELL CMOS IMAGER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

The present application is a divisional application of U.S. patent application Ser. No. 09/207,138, filed on Dec. 8, 1998 now U.S. Pat. No. 6,825,878, the disclosure of which is incorporated by reference herein.

FIELD OF THE INVENTION

The invention relates to a CMOS imager where the substrate is biased within a substrate voltage pump to reduce sub-threshold charge leakage across the transfer gate, the reset gate and the row select gate of the imager from the source to drain in the imager transistors. The invention also relates to a CMOS imager where the array is formed in a first well and the logic is formed in a second well such that the imager array and the imager logic can be independently optimized by doping the respective wells to reduce charge leakage from the array into the substrate and improve quantum efficiency.

DISCUSSION OF RELATED ART

There are a number of different types of semiconductor-based imagers, including charge coupled devices (CCDs), photodiode arrays, charge injection devices and hybrid focal plan arrays. CCDs are often employed for image acquisition and enjoy a number of advantages which makes it the incumbent technology, particularly for small size imaging applications. CCDs are also capable of large formats with small pixel size and they employ low noise charge domain processing techniques. However, CCD imagers also suffer from a number of disadvantages. For example, they are susceptible to radiation damage, they exhibit destructive read out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there has been some attempts to integrate on-chip signal processing with the CCD array, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel during charge transfer which also results in image smear.

Because of the inherent limitations in CCD technology, there is an interest in CMOS imagers for possible use as low cost imaging devices. A fully is compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD since standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate or a photodiode or photoconductor overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate or photodiode or photoconductor having a sensing node, typically a floating diffusion node, connected to the gate of an output transistor. The imager also includes at least one electronic device such as a transistor for transferring charge from the underlying portion of the substrate to the floating diffusion node and one device also typically a transistor for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photo diodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12) pp. 2046-2050, 1996; Mendis et al, "CMOS Active Pixel Image Sensors," IEEE Transactions on Electron Devices, Vol. 41(3) pp. 452-453, 1994 as well as U.S. Pat. Nos. 5,708,263 and 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, and GaAs. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-type layer 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-type layer 20. A transfer gate 28 is formed on insulating layer 22 between n+ type region 26 and a second n+ type region 30 formed in p-type layer 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below. A reset gate 32 is also formed on insulating layer 22 adjacent and between n+ type region 30 and another n+ region 34 which is also formed in p-type layer 20. The reset gate 32 and n+regions 30 and 34 form a reset transistor 31 which is controlled by a reset signal RST. The n+type region 34 is coupled to voltage source VDD. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source VDD and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source VSS. Transistor 39 is kept on by a signal VLN applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage VSS. The upper side of the capacitor 64 is also connected to the gate of a p-channel output transistor 66. The drain of the output transistor 66 is connected through a column select transistor 68 to a signal sample output node VOUTS and through a load transistor 70 to the voltage supply VDD. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage VSS. The upper side of the capacitor 74 is also connected to the gate of a p-channel output transistor 76. The drain of the output transistor 76 is connected through a p-channel column select transistor 78 to a reset sample output node VOUTR and through a load transistor 80 to the supply voltage VDD. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages VOUTR and VOUTS of the readout circuit 60. These voltages are then subtracted (VOUTS-VOUTR) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and the reset signal RST is nominally set at 2.5V. As can be seen from the figure, the process is begun at time $t_o$ by briefly pulsing reset voltage RST to 5V. The RST voltage, which is applied to the gate 32 of reset transistor 31, causes transistor 31 to turn on and the floating diffusion node 30 to charge to the VDD voltage present at n+ region 34 (less the voltage drop Vth of transistor 31). This resets the floating diffusion node 30 to a predetermined voltage (VDD-Vth). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26. A transfer gate voltage pulse TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19-29 1994; Mendis et al., "CMOS Active Pixel Image Sensors for Highly Integrated Imaging Systems," IEEE Journal of Solid State Circuits, Vol. 32(2), 1997; and Eric R, Fossum, "CMOS Image Sensors: Electronic Camera on a Chip," IEDM Vol. 95 pages 17-25 (1995) as well as other publications. These references are incorporated herein by reference.

Prior CMOS imagers suffer from increased noise due to leakage across the reset gate, transfer gate, and row select gate. Moreover, due to variation in electrical properties of the associated transistors due to the inevitable variations in the fabrication process, the magnitude of this transistor leakage varies giving rise to fixed pattern noise. Prior CMOS imagers have been fabricated in a single p-well which compromises performance. For high performance, high speed devices a more highly doped, shallow p-well is desired. For high quantum efficiency in the imager array a deeper p-well that will allow deeper photosensor depletion regions, and so a deeper and larger collection region for light (photons) incidence on the imager photosensitive element is desired.

SUMMARY OF THE INVENTION

The present invention provides a CMOS imaging device which includes a substrate biased at a negative voltage by a substrate voltage pump to prevent charge leakage across the transfer gate, the reset gate and the row select gate from source to drain. The invention also provides a CMOS imager where the imager array is formed in a first p-well and the imager logic is formed in a second p-well. By forming the array and logic in respective p-wells, the transistors in different parts of the imager can be optimally doped and biased to carry out their respective functions. Thus, the first p-well can be selectively doped to optimize the cross-talk, collection efficiency and transistor charge leakage, thereby improving the quantum efficiency of the sensor array, while the second p-well can be selectively doped to improve the speed, drive and readout circuitry of the imager.

The above and other advantages and features of the invention will be more clearly understood from the following detailed description which is provided in connection with the accompanying drawings.

DETAILED DESCRIPTION OF THE PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 4:
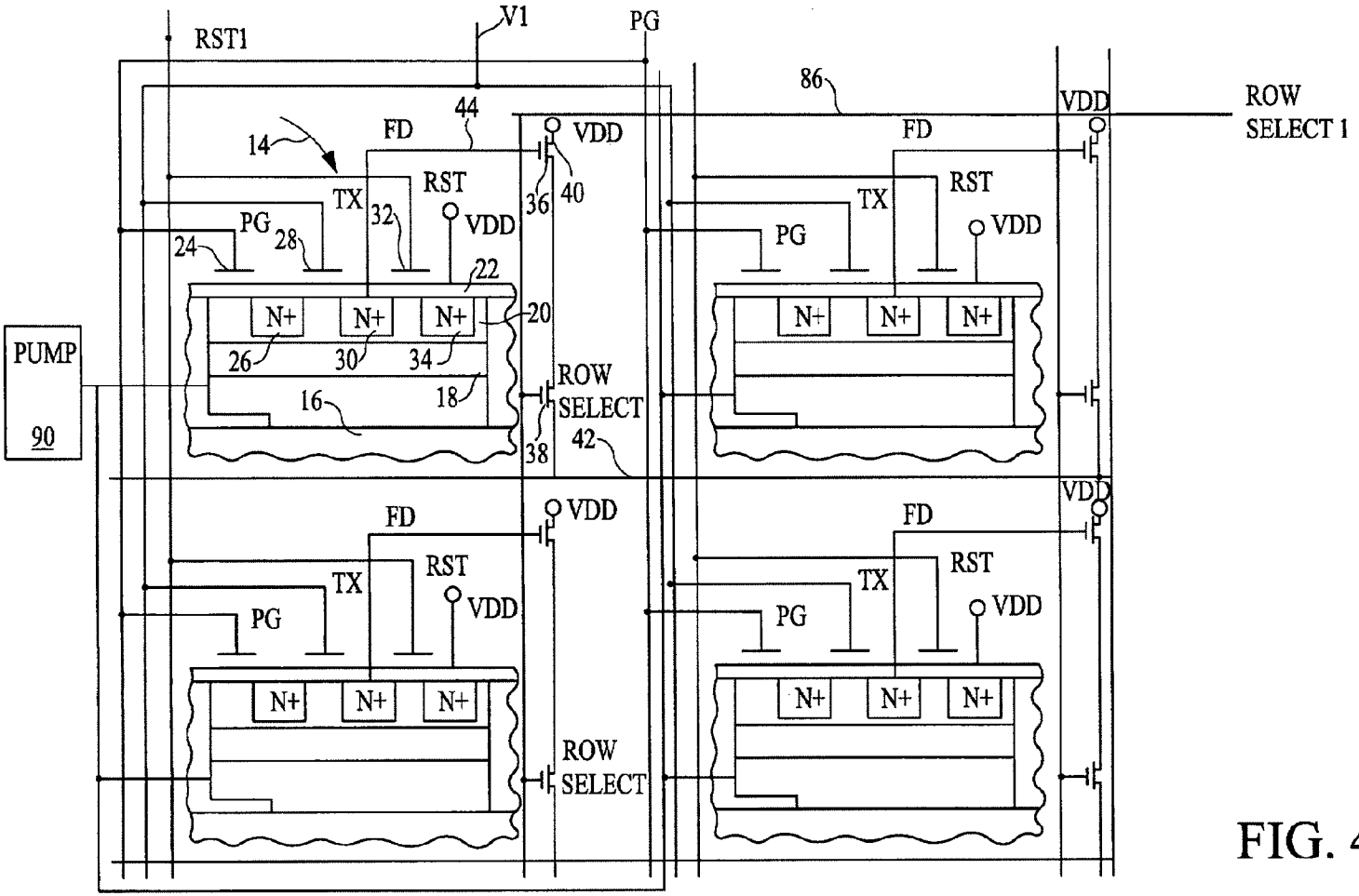
FIG. 4 is a representative pixel layout showing a 2×2 pixel layout according to one embodiment of the present invention.

The present invention will now be described with reference to the figures. Reference is now made to FIG. 4. This figure shows a portion of an active pixel array constructed according to a first embodiment of the present invention in which substrate pump 90 is used to supply a negative substrate voltage to the substrate to prevent source to drain leakage of the transistors in the substrate. This figure shows a 2×2 array of pixels for simplification. It should be understood that the invention is directed to a M×N multiple pixel array of any size.

The operation of the FIG. 4 pixel will now be described. Substrate 16 is connected to a substrate voltage pump 90 by line 92. Substrate pumps are well known in the art. See, for example, U.S. Pat. No. 4,820,936, the disclosure of which is herein incorporated by reference, showing a circuit having a substrate bias voltage generator. It is understood that any substrate voltage pump capable of biasing a semiconductor substrate may be used in the present invention. It should also be understood that the substrate voltage pump 90 may provide a negative charge to the substrate where the substrate includes n-channel transistors in a p-well. It should also be understood that the present invention relates to a substrate voltage pump that provides a positive charge to the substrate where the substrate includes p-channel transistors in an n-well.

Substrate voltage pump 90 provides a voltage to the substrate 16. Preferably the substrate voltage pump 90 is employed with n-channel transistors in a p-well. The substrate voltage pump 90 is configured to provide a voltage of from about −0.25 to about −2.5 volts, more preferably about −0.7 to about −1.5 volts, most preferably about −1.1 volts. It should be understood that the polarity of the voltage may differ depending upon whether the CMOS imager employs n-channel transistors in a p-well or p-channel transistors in an n-well.

By placing a voltage on the substrate, leakage across the transfer gate, reset transistor gate and row select gate from source to drain can be reduced. Reducing the leakage across the gate between source/drain of the transistors increases the charge output of the array and increases the signal to noise ratio of the array and enhances the performance of the transfer and reset and row select transistors.

Figure 2:
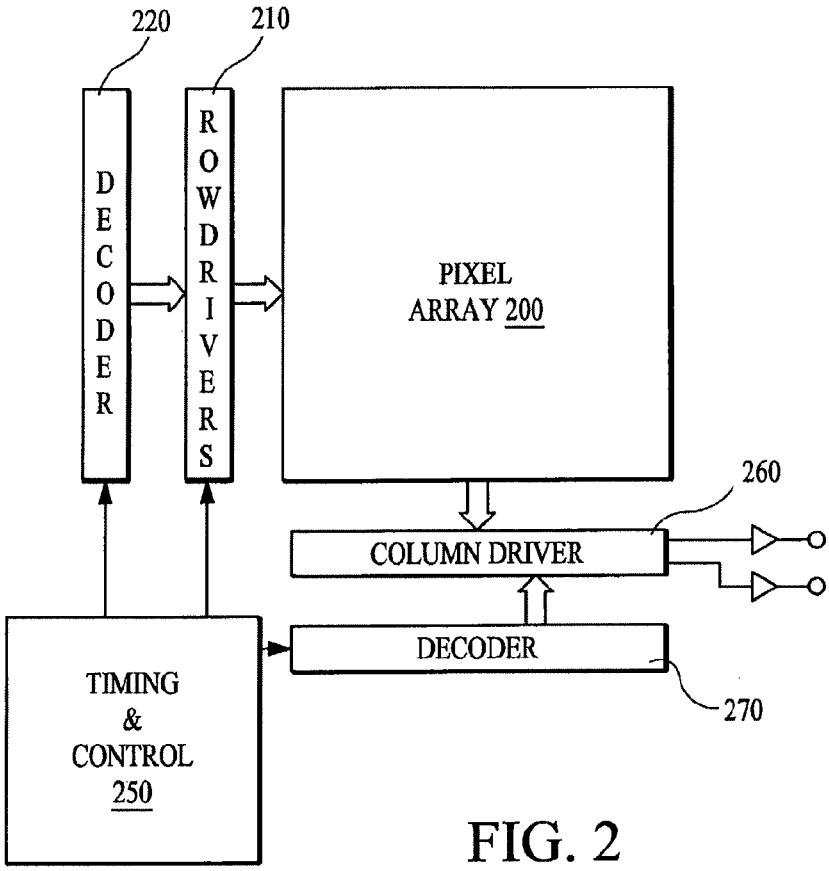
FIG. 2 is a block diagram of a CMOS active pixel sensor chip.
Figure 3:
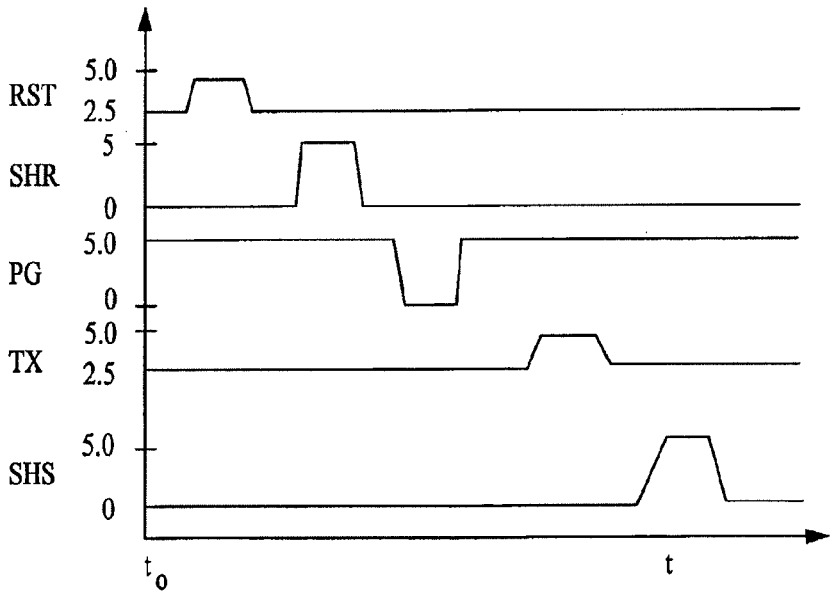
FIG. 3 is a representative timing diagram for the CMOS imager.

The invention will now be described further with respect to a CMOS imager having n-channel transistors in a p-well. In order to turn "on" the various transistors of the pixel array, a gate voltage to the transistor is needed which exceeds a source or drain voltage (depending on the type of transistor) by a threshold voltage Vth to overcome the negative voltage applied to the transistors by the substrate voltage pump 90. However, while a raised voltage may be needed to turn the transistors "on" the substrate voltage pump 90 ensures that all transistors are undoubtedly "off" when they are not activated, thus reducing charge leakage across the transistors. The operation of the FIG. 4 circuit to acquire, transfer and output pixel charge is otherwise as previously described with reference to FIGS. 1-3.

The remaining embodiments of the present invention will be described with reference to FIGS. 5-7 which relate to fabricating the array and the periphery logic in different wells in the substrate. Light in the red and green regions of the spectrum are absorbed deeper in the silicon than other light. By having a deeper array p-well the present invention allows adjustment in the n-type doping under the photosensitive element, i.e., a photogate, a photodiode or a photoconductor, so that a deep depletion region is achieved. This deep depletion region allows better collection of electrons generated by light in the red and green regions of the spectrum thereby improving the quantum efficiency or charge collection.

A deep or more lightly doped array p-well also results in reduced electric fields which reduces leakage from the n-type photosensor region to the substrate. This leakage produces signal noise. Reducing this leakage thus reduces noise and the signal/noise (S/N) performance of the imager is improved. Also, by having the array p-wells deep, the electrons generated deep in the silicon by red and green light are more likely to be absorbed and collected in the pixel onto which the light struck. With a shallow array p-well, it is more likely that these deep electrons will diffuse to a neighboring pixel and so be recorded in the wrong pixel location.

By having a separate p-well for the pixel array transistors and a separate p-well for the periphery logic transistors, the transistor threshold voltage, Vt of the pixel array transistors, can be independently adjusted relative to the Vt for the peripheral logic transistor. For example, the pixel array transistors can be set to relatively high Vt's to insure low leakage from source to drain when they are turned "off." Such high Vt's, while preferable for the pixel array transistors, would result in slow speed in the periphery logic. But this is not a problem with a dual p-well CMOS imager process as the periphery logic can have transistors independently optimized for low Vt and high speed as "off" leakage is not critical in the periphery logic.

Figure 5:
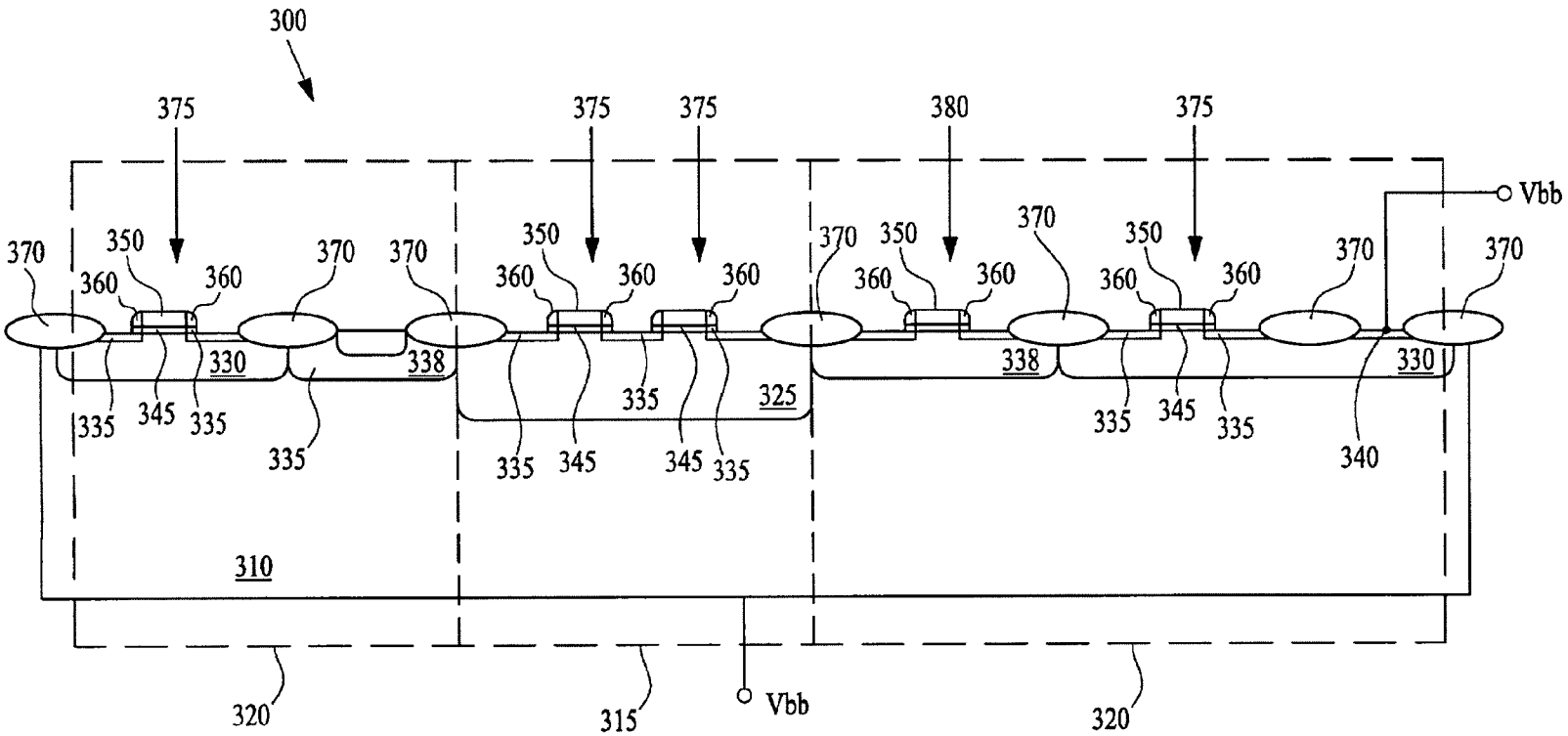
FIG. 5 illustrates a representative view of the substrate of the CMOS imager of a second embodiment of the present invention having separate p-wells for the array and the logic.

Referring now to FIG. 5. This figure illustrates a representative view of the substrate of the CMOS imager of a second embodiment of the present invention having separate wells for the pixel array transistors and the logic transistors. The cell 300 includes a substrate 310 of a first conductivity, preferably of a p-type conductivity, which includes an array area 315 (illustrated by the dashed lines). The array area 315 includes a deep p-well 325. The cell 300 also includes a periphery logic area 320 (indicated by dashed lines). The periphery logic area 320 includes a shallow p-well 330 and a shallow n-well 338.

The pixel array area 315 also includes field oxide regions 370, which serve to surround and isolate a pixel array 315. The field oxide regions 370 may be formed by thermal oxidation of the substrate using the LOCOS process or by the STI process which involve the chemical vapor deposition of an oxide material, or any other process for producing oxide regions 370.

The pixel array p-well 325 includes a plurality of n-doped regions 335 formed in the p-well 325. N-doped regions 335 are preferably doped to n+. These regions are used to form the source and drain regions of the n-channel transistors 375 of the sensor array. The n-channel transistors 375 include an oxide or other insulating layer 345 deposited on the substrate by conventional methods. Preferably the insulating layer 345 is formed of a silicon dioxide grown onto the substrate. The n-channel transistors 375 also include a transistor gate layer 350. Preferably the transistor gate layer 350 is formed of doped polysilicon. The transistor gate layer 350 may alternatively be formed of a composite layered structure of doped polysilicon/refractory metal silicide or doped polysilicon/refractory metal silicide/insulator for improved conductivity, if desired. Preferably the refractory metal silicide is a tungsten, titanium or cobalt silicide. The gates 350 of n-channel transistors 375 have insulating spacers 360 formed on their sides.

Figure 1:
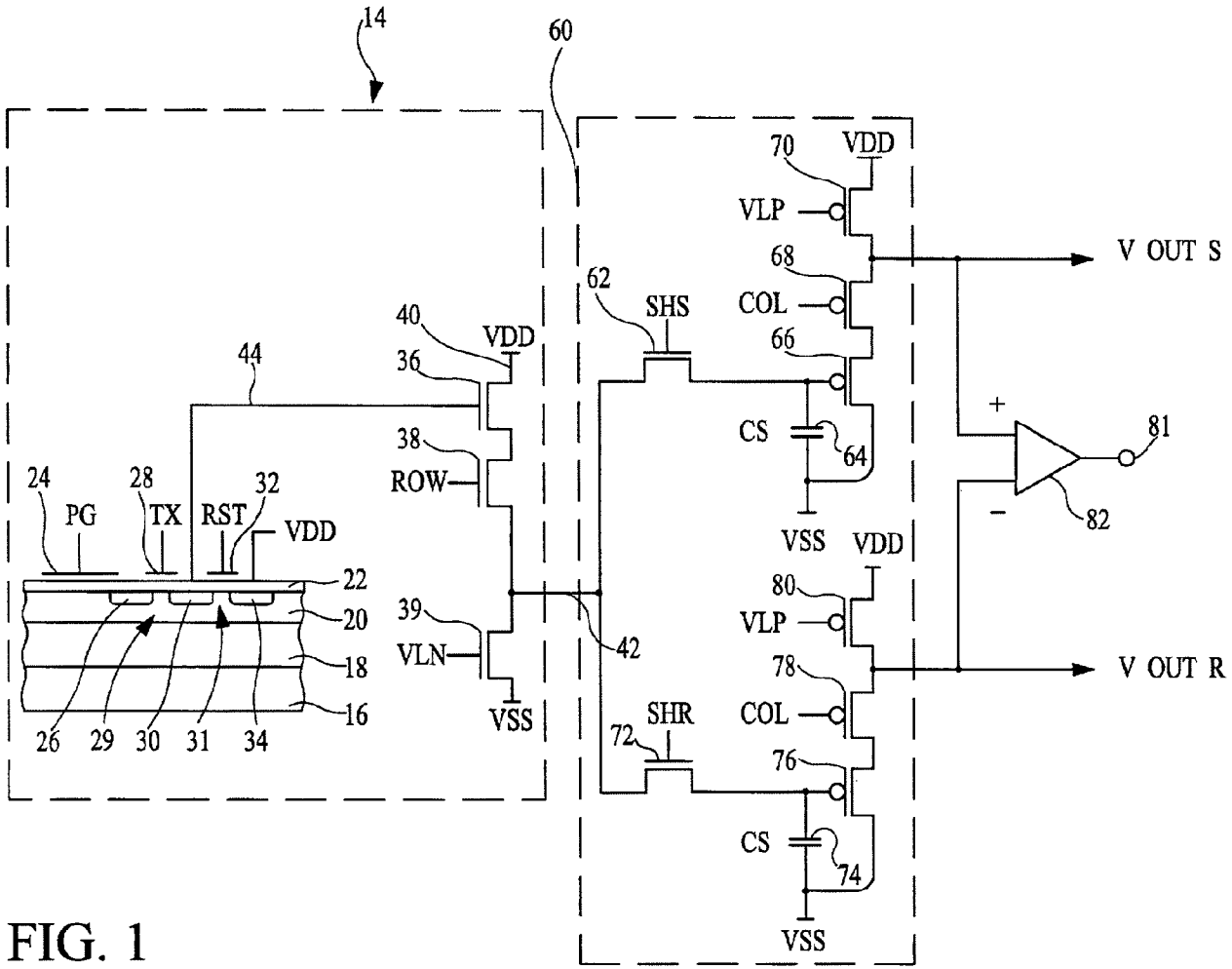
FIG. 1 is a representative circuit of a CMOS imager.

It should be understood that the n-channel transistors 375 are shown as representative transistors in the p-well 325. Each array p-well area 315 includes a photosensitive charge collection area, a transfer transistor, a reset transistor, a source follower transistor and a row select transistor, connected as shown in FIG. 1.

The periphery logic area 320 of the cell 300 includes a shallow n-well 338 formed adjacent to the deep p-well 325 of the array. The periphery logic area 320 also includes a shallow p-well 330 formed adjacent to the shallow n-well 338.

The periphery logic area 320 includes field oxide regions 370, which serve to surround and isolate the logic circuitry. As set forth above, the field oxide regions 370 may be formed by thermal oxidation of the substrate using the LOCOS process or by the STI process which involve the chemical vapor deposition of an oxide material or any other suitable method for forming the oxide regions 370. The periphery logic n-well 338 includes a plurality of p-doped regions 340 formed in the n-well. The p-doped regions are preferably doped to p+. These regions are used to form the source and drain regions of the p-channel transistors 380 of the periphery logic. The p-channel transistors 380 include an oxide or other insulating layer 345 deposited on the substrate by conventional methods. Preferably the insulating layer 345 is formed of a silicon dioxide grown onto the substrate. The p-channel transistors 380 also include a transistor gate layer 350. Preferably the transistor gate layer 350 is formed of doped polysilicon. The transistor gate layer 350 may alternatively be formed of a composite layered structure of doped polysilicon/refractory metal silicide or doped polysilicon/refractory metal silicide/insulator for improved conductivity, if desired. Preferably the refractory metal silicide is a tungsten, titanium or cobalt silicide. The gates 350 of the p-channel transistors 380 have insulating spacers 360 formed on their sides.

The periphery logic p-well 330 includes a plurality of n-doped regions 335 formed in the p-well 325. N-doped regions 335 are preferably doped to n+. These regions are used to form the source and drain regions of the n-channel transistors 375 of the periphery logic. The n-channel transistors 375 include an oxide or other insulating layer 345 deposited on the substrate by conventional methods. Preferably the insulating layer 345 is formed of a silicon dioxide grown onto the substrate. The n-channel transistors 375 also include a transistor gate layer 350. Preferably the transistor gate layer 350 is formed of doped polysilicon. The transistor gate layer 350 may alternatively be formed of a composite layered structure of doped polysilicon/refractory metal silicide or doped polysilicon/refractory metal silicide/insulator for improved conductivity, if desired, according to conventional methods. Preferably the refractory metal silicide is a tungsten or cobalt suicide. The n-channel transistors 375 have insulating spacers 360 formed on their sides.

It should be understood that the n-channel transistors 375 and the p-channel transistors 380 are shown as representative transistors in the p-well 330 and n-well 338 respectively. Generally, the periphery logic area 320 includes the readout circuit 60 as shown in FIG. 1.

The pixel array p-well 325 may be selectively and optimally doped to one level of doping by conventional methods to optimize the cross-talk, collection efficiency and transistor leakage, thereby improving the quantum efficiency and noise performance of the array. By placing the pixel array in a separate p-well 325, photosensor leakage (photogate, photodiode, photoconductor) to the substrate 310 can be minimized by such optimal doping of the p-well. Since the periphery logic transistors and the pixel array transistors are formed in separate p-wells, there is less concern for array performance characteristics such as quantum efficiency, photosensor leakage to substrate, cross-talk and array Vt optimization. The array p-well 325 is preferably doped with boron to optimize to those listed array characteristics of importance. The array p-well 325 is doped with boron implanted at a total dose of from about $1.0\times10^{11}$ ions/cm$^2$ to about $1.0\times10^{13}$ ions/cm$^2$, preferably from about $2.0\times10^{11}$ ions/cm$^2$ to about $5.0\times10^{12}$ ions/cm$^2$, most preferably from about $5.0\times10^{11}$ ions/cm$^2$. The array p-well 325 is doped lighter and deeper than logic p-well 330 so that photons can be collected from the silicon in the array p-well 325 from deeper areas of the substrate 310. Preferably p-well 325 is doped to a depth of from about 2 to about 8 microns with a preferred total implant of about $5\times10^{11}$ boron ions/cm$^2$ (or about $1.0\times10^{15}$ boron ions/cm$^3$) with a depth of about 5 microns.

The periphery logic transistors formed in the separate p-well 330 can also be selectively doped by conventional methods to provide high speed for the logic transistors. Charge loss to the substrate 310 is not as crucial in the logic circuit as it is in the pixel array because once the signal is received from the array it can be amplified in the logic circuit. However, high speed is important to the logic circuit. By placing the array transistors in a first p-well 325 and the periphery logic transistors in p-well 330 each transistor group can be separately optimized in the CMOS imager. For example, the logic p-well 330 is preferably doped with boron. The logic p-well 330 is doped with boron implanted at a total dose of from about $5.0\times10^{11}$ ions/cm$^2$ to about $5.0\times10^{13}$ ions/cm$^2$, preferably from about $1.0\times10^{12}$ ions/cm$^2$ to about $2.0\times10^{13}$ ions/cm$^2$, most preferably from about $4.0\times10^{12}$ ions/cm$^2$. The logic p-well 330 is doped heavier and more shallow than array p-well 325 because with the logic circuitry speed is an important parameter for logic circuits and not parameters such as quantum efficiency which have no bearing on logic circuit performance. Preferably p-well 330 is doped to a depth of from about 1 to about 5 microns with a preferred total implant of about $4\times10^{12}$ boron ions/cm$^2$ (or about $2.0\times10^{16}$ boron ions/cm$^3$)with a depth of about 3 microns.

The cell 300 shown in FIG. 5 can be biased at a substrate voltage Vbb with a substrate pump as described above with reference to FIG. 4. In this embodiment, the pixel array p-well 325 and the periphery logic p-well 330 are both biased to the same substrate pump voltage potential Vbb. The n-well regions 338 can be biased to a different potential Vss. By both tailoring the well depth and dopant concentration and applying a substrate voltage, source to drain leakage can be reduced. Reducing the leakage across the source/drain of the transistors increases the charge output of the array and increases the signal to noise ratio of the array and enhances the performance of the transfer and reset and row select transistors.

Figure 6:
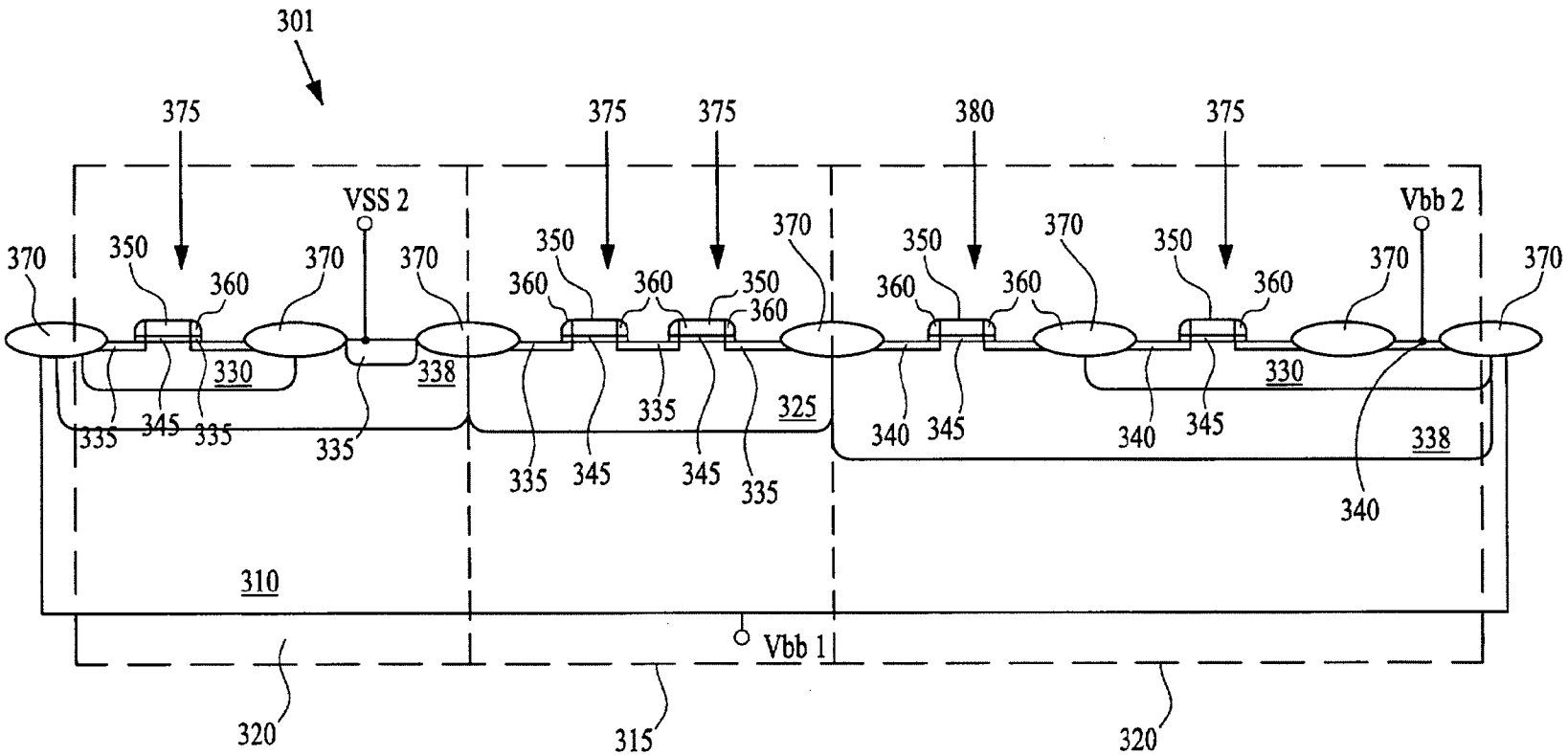
FIG. 6 illustrates a representative view of the substrate of the CMOS imager of a third embodiment of the present invention having separate p-wells for the array and the logic.

Reference is now made to FIG. 6 which illustrates a representative view of the substrate of the CMOS imager of a third embodiment of the present invention having separate p-wells for the array and the logic. The cell 301 includes a substrate 310 of a first conductivity, preferably of a p-type conductivity, which includes an army area 315 (illustrated by the dashed lines). The array area 315 includes a deep p-well 325. The cell 300 also includes a periphery logic area 320 (indicated by dashed lines). The periphery logic area 320 includes a shallow p-well 330 and a shallow n-well 338.

The cell 301 is similar to that described above with respect to FIG. 5. In the CMOS imager of the third embodiment, the periphery logic area 320 of the cell 300 includes a shallow n-well 338 formed adjacent to the deep p-well 325 of the array. The periphery logic area 320 includes a shallow p-well 330 formed within the shallow n-well 338, instead of a separate shallow p-well and n-well for the area 310 as in FIG. 5.

The periphery logic p-well 330 formed within n-well 338 includes a plurality of n-doped regions 335 formed in the p-well 325. As set forth above with reference to FIG. 5, n-doped regions 335 are preferably doped to n+. These regions are used to form the source and drain regions of the n-channel transistors 375 of the periphery logic. The n-channel transistors 375 are formed in a similar manner to those described above with reference to FIG. 5. It should again be understood that the n-channel transistors 375 and the p-channel transistors 380 are shown as representative transistors in the p-well 330 and n-well 338 respectively. Generally, the periphery logic area 320 includes the readout circuit 60 as shown in FIG. 1.

In FIG. 6 the array p-well 325 may be selectively and optimally doped to one level of doping by conventional methods to optimize the cross-talk, collection efficiency and transistor leakage, thereby improving the quantum efficiency and noise performance of the array. By placing the pixel array in a separate p-well 325, photosensor leakage (photogate, photodiode, photoconductor) to the substrate 310 can be minimized by such optimal doping of the p-well. Since the periphery logic transistors and the array transistors are formed in separate p-wells, there is less concern for array performance characteristics such as quantum efficiency, photosensor leakage to substrate, cross-talk and array Vt optimization. The array p-well 325 may be doped to a total concentration and depth as described above. The array p-well 325 is doped with boron implanted at a total dose of from about $1.0\times10^{11}$ ions/$cm^2$ to about $1.0\times10^{13}$ ions/$cm^2$, preferably from about $2.0\times10^{11}$ ions/$cm^2$ to about $5.0\times10^{12}$ ions/$cm^2$, most preferably from about $5.0\times10^{11}$ ions/$cm^2$. The array p-well 325 is doped lighter and deeper than logic p-well 330 so that photons can be collected from the silicon in the array p-well 325 from deeper areas of the substrate 310. Preferably p-well 325 is doped to a depth of from about 2 to about 8 microns with a preferred total implant of about $5\times10^{11}$ boron ions/$cm^2$ (or about $1.0\times10^{11}$ boron ions/$cm^3$)with a depth of about 5 microns.

The periphery logic transistors formed in the separate p-well 330 can also be selectively doped by conventional methods to provide high speed for the logic transistors. Charge loss to the substrate 310 is not as crucial in the logic circuit as it is in the array because once the signal is received from the array it can be amplified in the logic circuit. However, high speed is important to the logic circuit. By placing the array transistors in a first p-well 325 and the periphery logic transistors in p-well 330 each group can be separately optimized in the CMOS imager. For example, the logic p-well 330 may be doped to a total concentration and depth as described above. The logic p-well 330 is doped with boron implanted at a total dose of from about $5.0\times10^{11}$ ions/$cm^2$ to about $5.0\times10^{13}$ ions/$cm^2$, preferably from about $1.0\times10^{12}$ ions/$cm^2$ to about $2.0\times10^{13}$ ions/$cm^2$, most preferably from about $4.0\times10^{12}$ ions/$cm^2$. The logic p-well 330 is doped heavier and more shallow than array p-well 325 because with the logic circuitry speed is an important parameter for logic circuits and not parameters such as quantum efficiency which have no bearing on logic circuit performance. Preferably p-well 330 is doped to a depth of from about 1 to about 5 microns with a preferred total implant of about $4\times10^{12}$ boron ions/$cm^2$ (or about $2.0\times10^{16}$ boron ions/$cm^3$) with a depth of about 3 microns.

The cell 300 shown in FIG. 6 can be biased at a substrate voltage Vbb1 with a substrate pump as described above with reference to FIG. 4. In this embodiment, the array p-well 325 is biased to a first voltage Vbb1 and the periphery logic p-well 330 is biased to a second voltage Vbb2. The n-well regions 338 can be biased to a different potential Vss. By both tailoring the well depth and dopant concentration and applying a substrate voltage, source to drain leakage can be reduced. Reducing the leakage across the source/drain of the transistors increases the charge output of the array and increases the signal to noise ratio of the array and enhances the performance of the transfer and reset and row select transistors.

Figure 7:
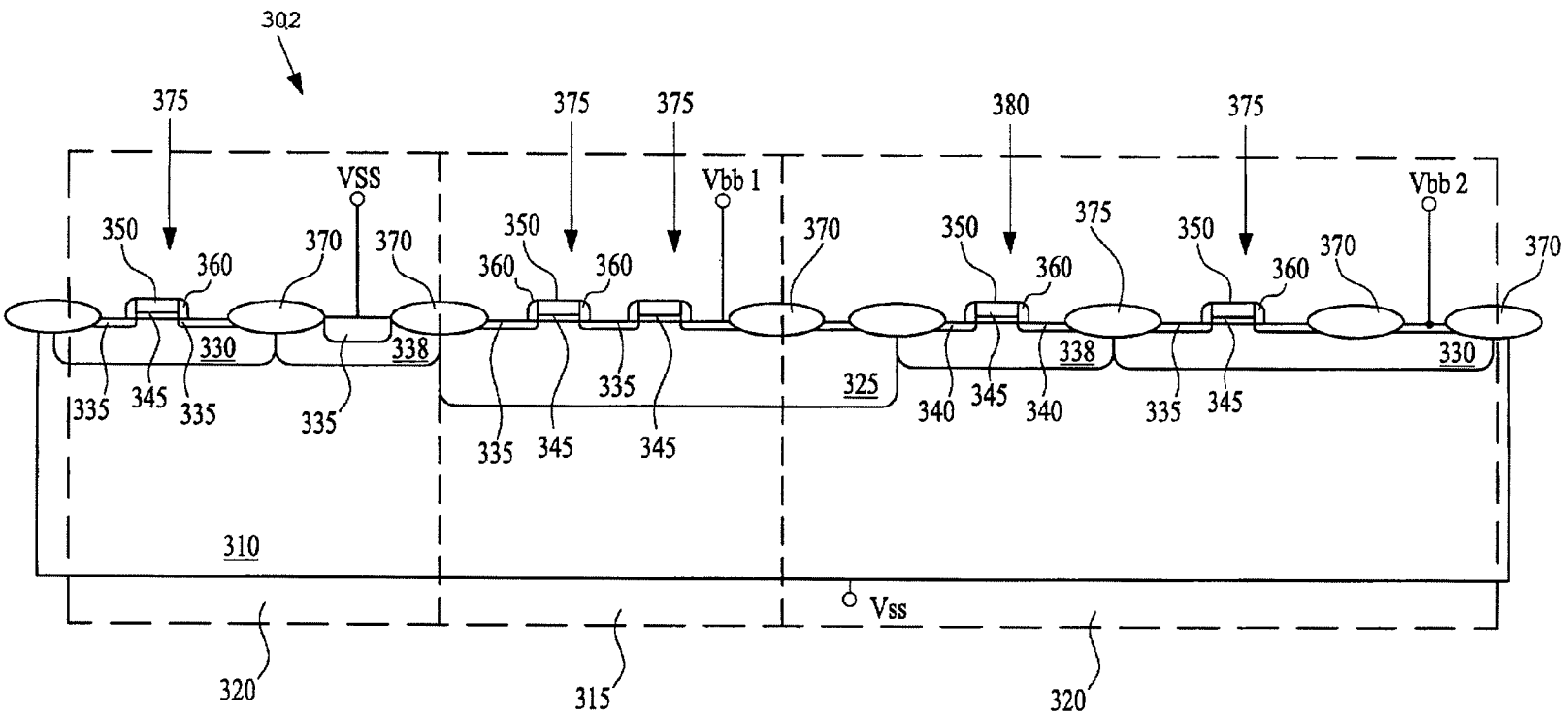
FIG. 7 illustrates a representative view of the substrate of the CMOS imager of a fourth embodiment of the present invention having separate p-wells for the array and the logic.

Reference is now made to FIG. 7 which illustrates a representative view of the substrate of the CMOS imager of a fourth embodiment of the present invention having separate p-wells for the array and the logic with an n-type substrate. The cell 302 includes a substrate 310 of a first conductivity, preferably of a p-type conductivity, which includes a pixel array area 315 (illustrated by the dashed lines). The array area 315 includes a deep p-well 325. The cell 302 also includes a periphery logic area 320 (indicated by dashed lines). The periphery logic area 320 includes a shallow p-well 330 and a shallow n-well 338. The CMOS imager according to FIG. 7 is similar to that described with reference to FIG. 5 above except as herein described.

The FIG. 7 array p-well 325 may be selectively and optimally doped to one level of doping by conventional methods to optimize the cross-talk, collection efficiency and transistor leakage, thereby improving the quantum efficiency and noise performance of the array. By placing the array in a separate p-well 325, photosensor leakage (photogate, photodiode, photoconductor) to the substrate 310 can be minimized by such optimal doping of the p-well. Since the periphery logic transistors and the array transistors are formed in separate p-wells, there is less concern for array performance characteristics such as quantum efficiency, photosensor leakage to substrate, cross-talk and array Vt optimization. The array p-well 325 and the periphery logic p-well 330 may be doped to a total concentration and depth as described above with reference to FIG. 5. The periphery logic p-well 330 can also be selectively doped by conventional methods to provide high speed for the logic transistors. Charge loss to the substrate 310 is not as crucial in the logic circuit as it is in the array because once the signal is received from the array it can be amplified in the logic circuit. However, high speed is important to the logic circuit. By placing the array transistors in a first p-well 325 and the periphery logic transistors in p-well 330 each group can be separately optimized in the CMOS imager.

The cell 302 shown in FIG. 7 can be biased at a substrate voltage Vss with a substrate pump as described above with reference to FIG. 4. In this embodiment, the array p-well 325 is biased to a first voltage Vbb1 and the periphery logic p-well 330 is biased to a second voltage Vbb2. The n-well regions 338 can be biased to a different potential Vss. By both tailoring the well depth and dopant concentration and applying a substrate voltage, source to drain leakage can be reduced. Reducing the leakage across the source/drain of the transistors increases the charge output of the array and increases the signal to noise ratio of the array and enhances the performance of the transfer and reset and row select transistors.

Figure 8:
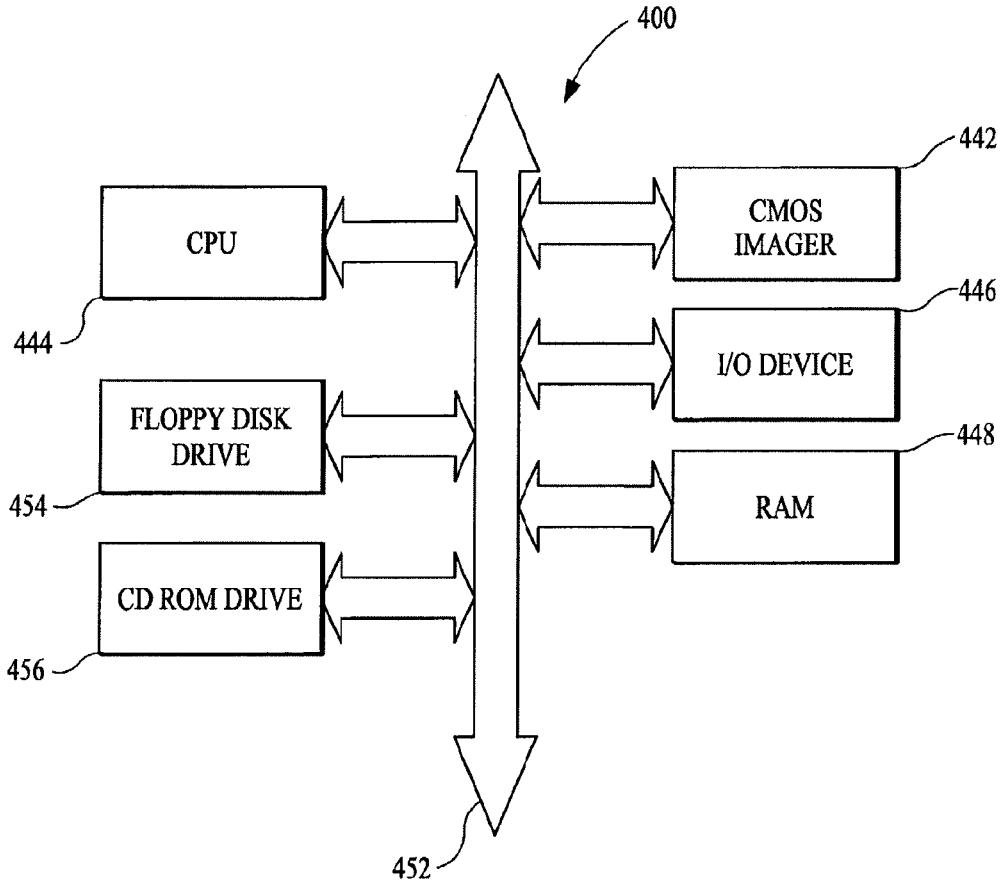
FIG. 8 is an illustration of a computer system employing a CMOS imager according to the present invention.

A typical processor based system which includes a CMOS imager device according to the present invention is illustrated generally at 400 in FIG. 8. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444 that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes the substrate voltage pump 90 or a CMOS imager having the array and the logic in separate p-wells, as previously described with respect to FIGS. 4-7.

It should again be noted that although the invention has been described with specific reference to specific CMOS circuits having a photogate and a floating diffusion, the invention has broader applicability and may be used in any imaging apparatus. Similarly, the process described above is but one method of many that could be used. Accordingly, the above description and accompanying drawings are only illustrative of preferred embodiments which can achieve the features and advantages of the present invention. It is not intended that the invention be limited to the embodiments shown and described in detail herein. Accordingly, the invention is not limited by the forgoing descriptions, but is only limited by the scope of the following claims.

What is claimed as new and desired to be protected by Letters Patent of the United States is:

1. An imaging device comprising:

a substrate;

a photosensitive area within a first p-well formed in said substrate for accumulating photo-generated charge in said area; and a periphery logic area within in a second p-well in said substrate; and a n-well disposed between said first and second p-wells, wherein said first p-well is deeper than said second p-well and said second p-well is doped to a higher ion concentration than said first p-well.

2. The imaging device according to claim 1, wherein the accumulation of charge in said photosensitive area is controlled by a photogate.

3. The imaging device according to claim 1, wherein said photosensitive area comprises a photodiode.

4. The imaging device according to claim 1, wherein the accumulation of charge in said photosensitive area is controlled by a photoconductor.

5. The imaging device according to claim 1, wherein said first p-well is doped to reduce cross-talk, increase collection efficiency and reduce transistor leakage in said imaging device.

6. The imaging device according to claim 5, wherein said first p-well is doped with boron.

7. The imaging device according to claim 6, wherein said first p-well is doped with boron implanted at a total dose of from about $1.0\times10^{11}$ ions/cm$^2$ to about $1.0\times10^{13}$ ions/cm$^2$.

8. The imaging device according to claim 6, wherein said first p-well is doped with boron implanted at a total dose of from about $2.0\times10^{11}$ ions/cm$^2$ to about $5.0\times10^{12}$ ions/cm$^2$.

9. The imaging device according to claim 6, wherein said first p-well is doped with boron implanted at a total dose of about $5.0\times10^{11}$ ions/cm$^2$.

10. The imaging device according to claim 1, wherein said first p-well has a depth of from about 2 to about 8 microns.

11. The imaging device according to claim 10, wherein said first p-well has a depth of about 5 microns.

12. The imaging device according to claim 1, wherein said second p-well is selectively doped to provide high speed in said imaging device.

13. The imaging device according to claim 12, wherein said second p-well is doped with boron.

14. The imaging device according to claim 12, wherein said second p-well is doped with boron implanted at a total dose of from about $5.0\times10^{11}$ ions/cm$^2$ to about $5.0\times10^{13}$ ions/cm$^2$.

15. The imaging device according to claim 12, wherein said second p-well is doped with boron implanted at a total dose of from about $1.0\times10^{12}$ ions/cm$^2$ to about $2.0\times10^{13}$ ions/cm$^2$.

16. The imaging device according to claim 12, wherein said second p-well is doped with boron implanted at a total dose of about $4.0\times10^{12}$ ions/cm$^2$.

17. The imaging device according to claim 1, wherein said first p-well is doped with boron at a total dose of from about $1.0\times10^{11}$ ions/cm$^2$ to about $1.0\times10^{13}$ ions/cm$^2$ and said second p-well is doped with boron at a total dose of from about $5.0\times10^{11}$ ions/cm$^2$ to about $5.0\times10^{13}$ ions/cm$^2$.

18. The imaging device according to claim 17, wherein said first p-well is doped with boron at a total dose of from about $2.0\times10^{11}$ ions/cm$^2$ to about $5.0\times10^{12}$ ions/cm$^2$ and said second p-well is doped with boron at a total dose of from about $1.0\times10^{12}$ ions/cm$^2$ to about $2.0\times10^{13}$ ions/cm$^2$.

19. The imaging device according to claim 17 wherein said first p-well is doped with boron at a total dose of about $5\times10^{11}$ and has a depth of about 2 to 8 microns and said second p-well is doped with boron at a total dose of about $4\times10^{12}$ and has a depth of about 1 to 5 microns.

20. The imaging device according to claim 19 wherein said first p-well is doped with boron at a total dose of about $5\times10^{11}$ and has a depth of about 5 microns and said second p-well is doped with boron at a total dose of about $4\times10^{12}$ and has a depth of about 3 microns.

21. The imaging device according to claim 1, wherein an n-well is formed in said substrate between said first p-well and said second p-well.

22. The imaging device according to claim 1, wherein said second p-well is formed within an n-well.

23. The imaging device according to claim 1, further comprising a first substrate voltage pump coupled to a supply voltage and connected to supply said first p-well with a first predetermined voltage.

24. The imaging device according to claim 23, further comprising a second substrate voltage pump coupled to a supply voltage and connected to supply said second p-well with a second predetermined voltage.

25. The imaging device according to claim 22, further comprising:

a first substrate voltage pump coupled to a supply voltage and connected to supply said first p-well with a first predetermined voltage;

a second substrate voltage pump coupled to a supply voltage and connected to supply said second p-well with a second predetermined voltage; and a third substrate voltage pump coupled to a supply voltage and connected to supply said n-well with a third predetermined voltage.

26. The imaging device according to claim 1, wherein the first and second p-wells are disjoint.

27. The imaging device according to claim 1, wherein the n-well is in direct contact with the substrate.

28. An imaging device including a semiconductor integrated circuit substrate, said imaging device comprising:

a photosensitive device formed in a first p-well in said substrate for accumulating photo-generated charge in an underlying portion of said substrate, said photosensitive device comprising a first transistor;

a periphery logic area formed in a second p-well in said substrate, said periphery logic area comprising a second transistor; and a n-well disposed between said first and second p-wells, wherein said first transistor has a higher threshold voltage than said second transistor, said first p-well is deeper than said second p-well, and said second p-well is doped to a higher ion concentration than said first p-well.

29. The imaging device according to claim 28, wherein said photosensitive device is a photogate.

30. The imaging device according to claim 28, wherein said photosensitive device is a photodiode.

31. The imaging device according to claim 28, wherein said photosensitive device is a photoconductor.

32. The imaging device according to claim 28, wherein said first p-well is selectively doped to optimize the cross-talk, collection efficiency and transistor leakage in said imaging device.

33. The imaging device according to claim 32, wherein said first p-well is doped with boron.

34. The imaging device according to claim 33, wherein said first p-well is doped with boron implanted at a total dose of from about $1.0\times10^{11}$ ions/cm$^2$ to about $1.0\times10^{13}$ ions/cm$^2$.

35. The imaging device according to claim 33, wherein said first p-well is doped with boron implanted at a total dose of from about $2.0\times10^{11}$ ions/cm$^2$ to about $5.0\times10^{12}$ ions/cm$^2$.

36. The imaging device according to claim 33, wherein said first p-well is doped with boron implanted at a total dose of about $5.0\times10^{11}$ ions/cm$^2$.

37. The imaging device according to claim 28, wherein said first p-well has a depth of from about 2 to about 8 microns.

38. The imaging device according to claim 37, wherein said first p-well has a depth of about 5 microns.

39. The imaging device according to claim 28, wherein said second p-well is selectively doped to provide high speed in said imaging device.

40. The imaging device according to claim 39, wherein said second p-well is doped with boron.

41. The imaging device according to claim 40, wherein said second p-well is doped with boron implanted at a total dose of from about $5.0\times10^{11}$ ions/cm$^2$ to about $5.0\times10^{13}$ ions/cm$^2$.

42. The imaging device according to claim 40, wherein said second p-well is doped with boron implanted at a total dose of from about $1.0\times10^{12}$ ions/cm$^2$ to about $2.0\times10^{13}$ ions/cm$^2$.

43. The imaging device according to claim 40, wherein said second p-well is doped with boron at a concentration of about $4.0\times10^{12}$ ions/cm$^2$.

44. The imaging device according to claim 28, wherein said first p-well is doped with boron at a total dose of from about $1.0\times10^{11}$ ions/cm$^2$ to about $1.0\times10^{13}$ ions/cm$^2$ and said second p-well is doped with boron at a total dose of from about $5.0\times10^{11}$ ions/cm$^2$ to about $5.0\times10^{13}$ ions/cm$^2$.

45. The imaging device according to claim 44, wherein said first p-well is doped with boron at a total dose of from about $2.0\times10^{11}$ ions/cm$^2$ to about $5.0\times10^{12}$ ions/cm$^2$ and said second p-well is doped with boron at a total dose of from about $1.0\times10^{12}$ ions/cm$^2$ to about $2.0\times10^{13}$ ions/cm$^2$.

46. The imaging device according to claim 43 wherein said first p-well is doped with boron at a total dose of about $5\times10^{11}$ and has a depth of about 2 to 8 microns and said second p-well is doped with boron at a total dose of about $4\times10^{12}$ and has a depth of about 1 to 5 micron.

47. The imaging device according to claim 28, wherein said wells are formed in an n-type substrate.

48. The imaging device according to claim 28, further comprising a substrate voltage pump coupled to a supply voltage and connected to supply said substrate with a voltage.

49. The imaging device according to claim 28, further comprising a first substrate voltage pump coupled to a supply voltage and connected to supply said first p-well with a first predetermined voltage.

50. The imaging device according to claim 49, further comprising a second substrate voltage pump coupled to a supply voltage and connected to supply said second p-well with a second predetermined voltage.

51. The imaging device according to claim 47, further comprising:

a first substrate voltage pump coupled to a supply voltage and connected to supply said first p-well with a first predetermined voltage;

a second substrate voltage pump coupled to a supply voltage and connected to supply said second p-well with a second predetermined voltage; and a third substrate voltage pump coupled to a supply voltage and connected to supply said n-type substrate with a third predetermined voltage.

52. The imaging device according to claim 28, wherein the first and second p-wells are disjoint.

53. The imaging device according to claim 28, wherein the n-well is in direct contact with the substrate.

54. An imaging system comprising:

a processor; and a CMOS imaging device coupled to said processor and including:

a photosensitive area within a first p-well in a substrate for accumulating photo-generated charge in said area;

a periphery logic area formed in a second p-well in said substrate; and a n-well disposed between said first and second p-wells, wherein said first p-well is doped to a greater depth than said second p-well and said second p-well is doped to a higher ion concentration than said first p-well.

55. The system according to claim 54, wherein the accumulation of charge in said photosensitive area is controlled by a photogate.

56. The system according to claim 54, wherein said photosensitive area is a photodiode.

57. The system according to claim 54, wherein said photosensitive area is controlled by a photoconductor.

58. The system according to claim 54, wherein said first p-well is selectively doped to optimize the cross-talk, collection efficiency and transistor leakage.

59. The system according to claim 54, wherein said first p-well is doped with boron.

60. The system according to claim 59, wherein said first p-well is doped with boron implanted at a total dose of from about $1.0\times10^{11}$ ions/cm$^2$ to about $1.0\times10^{13}$ ions/cm$^2$.

61. The system according to claim 59, wherein said first p-well is doped with boron implanted at a total dose of from about $2.0\times10^{11}$ ions/cm$^2$ to about $5.0\times10^{12}$ ions/cm$^2$.

62. The system according to claim 59, wherein said first p-well is doped with boron implanted at a total dose of about $5.0\times10^{11}$ ions/cm$^2$.

63. The system according to claim 54, wherein said first p-well has a depth of from about 2 to about 8 microns.

64. The system according to claim 63, wherein said first p-well has a depth of about 5 microns.

65. The system according to claim 54, wherein said second p-well is selectively doped to provide high speed in said imaging device.

66. The system according to claim 65, wherein said second p-well is doped with boron.

67. The system according to claim 65, wherein said second p-well is doped with boron implanted at a total dose of from about $5.0\times10^{11}$ ions/cm$^2$ to about $5.0\times10^{13}$ ions/cm$^2$.

68. The system according to claim 65, wherein said second p-well is doped with boron implanted at a total dose of from about $1.0\times10^{12}$ ions/cm$^2$ to about $2.0\times10^{13}$ ions/cm$^2$.

69. The system according to claim 65, wherein said second p-well is doped with boron at a concentration of about $4.0\times10^{12}$ ions/cm$^2$.

70. The imaging device according to claim 54, wherein said first p-well is doped with boron at a total dose of from about $1.0\times10^{11}$ ions/cm$^2$ to about $1.0\times10^{13}$ ions/cm$^2$ and said second p-well is doped with boron at a total dose of from about $5.0\times10^{11}$ ions/cm$^2$ to about $5.0\times10^{13}$ ions/cm$^2$.

71. The imaging device according to claim 70, wherein said first p-well is doped with boron at a total dose of from about $2.0\times10^{11}$ ions/cm$^2$ to about $5.0\times10^{12}$ ions/cm$^2$ and said second p-well is doped with boron at a total dose of from about $1.0\times10^{12}$ ions/cm$^2$ to about $2.0\times10^{13}$ ions/cm$^2$.

72. The imaging device according to claim 70 wherein said first p-well is doped with boron at a total dose of about $5\times10^{11}$ and has a depth of about 2 to 8 microns and said second p-well is doped with boron at a total dose of about $4\times10^{12}$ and has a depth of about 1 to 5 micron.

73. The system according to claim 54, wherein said second p-well is formed within an n-well.

74. The system according to claim 54, further comprising a substrate voltage pump coupled to a supply voltage and connected to supply said substrate with a voltage.

75. The system according to claim 54, further comprising a first substrate voltage pump coupled to a supply voltage and connected to supply said first p-well with a first predetermined voltage.

76. The system according to claim 75, further comprising a second substrate voltage pump coupled to a supply voltage and connected to supply said second p-well with a second predetermined voltage.

77. The system according to claim 73, further comprising:

a first substrate voltage pump coupled to a supply voltage and connected to supply said first p-well with a first predetermined voltage;

a second substrate voltage pump coupled to a supply voltage and connected to supply said second p-well with a second predetermined voltage; and a third substrate voltage pump coupled to a supply voltage and connected to supply said n-well with a third predetermined voltage.

78. The imaging device according to claim 54, wherein the first and second p-wells are disjoint.

79. The imaging device according to claim 54, wherein the n-well is in direct contact with the substrate.

*80. A CMOS imager, comprising:*

*a pixel array comprising a pixel coupled to a column output line to provide a pixel output signal to the column output line, the pixel including a first n-channel reset transistor comprising a first p-well region of the array, wherein the first n-channel reset transistor has a first threshold voltage;*

*a peripheral region, including a readout circuit coupled to the column output line, to receive the pixel output signal from the array, the peripheral region including a second n-channel transistor including a second p-well region of the periphery and a p-channel transistor including an n-well region of the periphery, wherein the second n-channel transistor has a second threshold voltage that is independent from the first threshold voltage, and the n-well region is disposed between the first and second p-well regions; and*

*a voltage pump to provide a negative voltage to the first n-channel reset transistor to turn off the n-channel reset transistor.*

*81. The CMOS imager of claim 80, wherein the voltage pump is coupled to the first p-well region.*

*82. The CMOS imager of claim 80, wherein the first threshold voltage is higher than the second threshold voltage.*

* * * * *